(12) United States Patent
Zhou et al.

(10) Patent No.: US 11,678,514 B2
(45) Date of Patent: Jun. 13, 2023

(54) ORGANIC LIGHT-EMITTING DIODE (OLED) DISPLAY PANEL AND DISPLAY DEVICE

(71) Applicant: Wuhan China Star Optoelectronics Semiconductor Display Technology Co., Ltd., Wuhan (CN)

(72) Inventors: Yang Zhou, Wuhan (CN); Mugyeom Kim, Wuhan (CN); Hong Gao, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 436 days.

(21) Appl. No.: 16/612,407

(22) PCT Filed: Oct. 17, 2019

(86) PCT No.: PCT/CN2019/111616
§ 371 (c)(1),
(2) Date: Oct. 15, 2020

(87) PCT Pub. No.: WO2020/253000
PCT Pub. Date: Dec. 24, 2020

(65) Prior Publication Data
US 2021/0083020 A1    Mar. 18, 2021

(30) Foreign Application Priority Data
Jun. 18, 2019   (CN) ......................... 201910524147.3

(51) Int. Cl.
*H10K 59/12*   (2023.01)
*H10K 71/00*   (2023.01)
(Continued)

(52) U.S. Cl.
CPC .......... *H01L 27/3244* (2013.01); *H01L 51/56* (2013.01); *H01L 2251/5338* (2013.01)

(58) Field of Classification Search
None
See application file for complete search history.

(56) References Cited

U.S. PATENT DOCUMENTS 9,195,108 B2 * 11/2015 Park ................... G02F 1/13306
10,211,276 B2 *  2/2019 Choi ................... H01L 51/5246
(Continued)

FOREIGN PATENT DOCUMENTS

CN       1984524     6/2007
CN     103700320     4/2014
(Continued)

*Primary Examiner* — J. E. Schoenholtz
(74) *Attorney, Agent, or Firm* — PV IP PC; Wei Te Chung; Zhigang Ma (57) ABSTRACT

The present disclosure provides an organic light emitting diode (OLED) display panel and a display panel which include a display region, a binding region, and a bending region. A metal trace inside the bending regions generates a tensile stress region and a compressive stress region. A plurality of through holes are disposed on the metal trace. A distribution density of the through holes corresponding to the tensile stress region is different from distribution density of the through holes corresponding to the compressive stress region. It may relieve the stress, reduce the problems such as failure and bad products, reduce the bending angle to be smaller, and achieve narrower borders.

20 Claims, 5 Drawing Sheets

(51) Int. Cl.
    *H10K 102/00*     (2023.01)
    *H01L 27/32*     (2006.01)
    *H01L 51/56*     (2006.01)

(56) References Cited

U.S. PATENT DOCUMENTS

| | | | |
|---|---|---|---|
| 10,637,007 B1 | 4/2020 | Wang et al. | |
| 10,672,755 B2* | 6/2020 | Wu | G02F 1/133308 |
| 10,856,420 B2* | 12/2020 | Kim | H05K 1/18 |
| 2015/0382446 A1 | 12/2015 | Kwon et al. | |
| 2018/0011514 A1 | 1/2018 | Yoo et al. | |
| 2020/0035775 A1* | 1/2020 | Kim | H01L 51/5253 |
| 2020/0343333 A1* | 10/2020 | Cho | H01L 23/5283 |
| 2022/0173202 A1* | 6/2022 | Saitoh | H01L 27/3276 |
| 2022/0254867 A1* | 8/2022 | Lin | G09F 9/3026 |
| 2022/0293713 A1* | 9/2022 | Kim | H01L 51/0097 |

FOREIGN PATENT DOCUMENTS

| | | |
|---|---|---|
| CN | 206058795 | 3/2017 |
| CN | 107610593 | 1/2018 |
| CN | 108281387 | 7/2018 |
| CN | 108831909 | 11/2018 |
| CN | 108877513 | 11/2018 |
| CN | 109065589 | 12/2018 |
| CN | 109148534 | 1/2019 |
| CN | 110335544 | 10/2019 |
| CN | 109377890 | 9/2020 |
| KR | 2018-0007048 | 1/2018 |

\* cited by examiner

ORGANIC LIGHT-EMITTING DIODE (OLED) DISPLAY PANEL AND DISPLAY DEVICE

RELATED APPLICATIONS

This application is a National Phase of PCT Patent Application No. PCT/CN2019/111616 having International filing date of Oct. 17, 2019, which claims the benefit of priority of Chinese Patent Application No. 201910524147.3 filed on Jun. 18, 2019. The contents of the above applications are all incorporated by reference as if fully set forth herein in their entirety.

FIELD AND BACKGROUND OF THE INVENTION

The present invention relates to a field of display panel, and more particularly, to an organic light-emitting diode (OLED) display panel and display device.

Organic light-emitting diode (OLEDs) get great attention from academia and industry for their great potential in solid-state lighting and flat panel display. With rapid development of OLED display panels, products such as flexible display panels and bendable display panels are prospering. However, a large number of metal traces for signal transmission are integrated into a lower edge of the OLED display panel, and are folded and fixed to the back side of the OLED display panel in the process of the back-end module, which brings serious risk. That is, stress generated during the long bending process allows the stress of the metal trace to be concentrated in such region which may create cracks. Moreover, the crack can extend to the entire cross section of the metal trace, resulting in failure of signal transmission, abnormality of the screen, and the like. The yield of the OLED display panel cannot be guaranteed, and the feasibility of mass production cannot be achieved.

Accordingly, the present invention provides a novel OLED display panel and display device to solve the above-mentioned technical problems.

SUMMARY OF THE INVENTION

An organic light emitting diode (OLED) display panel and display device are provided to solve technical problems of the conventional OLED display panel and display device, which may create cracks by concentrating the stress of the metal traces disposed on the bending region when bending, thereby causing the failure of signal transmission and abnormality of the screen.

To solve the technical problems mentioned above, the technical solution provided by the present invention are shown as follows:

An OLED display panel provided in one embodiment of the present disclosure includes:

a display region, and a back of the display region is provided with a first backplane;

a binding region disposed on the back of the display region, and a surface of the binding region is provided with a second backplane; and a bending region disposed between the display region and the binding region, and an inside of the bending region is provided with a metal trace;

the metal trace generates a tensile stress region and a compressive stress region when the bending region bends toward the binding region, a plurality of through holes are disposed on the metal trace, and a distribution density of the through holes corresponding to the tensile stress region is different from distribution density of the through holes corresponding to the compressive stress region.

In one embodiment, the distribution density of the through holes corresponding to the tensile stress region is greater than the distribution density of the through holes corresponding to the compressive stress region.

In one embodiment, the bending region in a bent state is in a shape of semicircle arc.

In one embodiment, centerlines of the through holes intersect at one or more points.

In one embodiment, the bending region in a bent state is in a shape of non-semicircle arc.

In one embodiment, the bending region includes a first bending region, a second bending region, and a third bending region, the second bending region is adjacent to the display region, the third bending region is adjacent to the binding region, the first bending region is positioned between the second bending region and the third bending region, the first bending region is in a shape of semicircle arc, and a centerline of the OLED display panel is overlapped with a bend apex of the bending region.

In one embodiment, the through holes are disposed inside the first bending region.

In one embodiment, the bending region includes a first bending region, a second bending region, and a third bending region, the second bending region is adjacent to the display region, the third bending region is adjacent to the binding region, the first bending region is positioned between the second bending region and the third bending region, the first bending region is in a shape of semicircle arc, and a centerline of the OLED display panel is not overlapped with a bend apex of the bending region, and a length of the third bending region is shorter than length of the second bending region.

In one embodiment, the through holes are disposed inside the first bending region and the third bending region.

In one embodiment, a reinforcing plate is disposed between the first backplane and the second backplane.

An OLED display panel provided in one embodiment of the present disclosure includes:

a display region;

A back of the display region is provided with a binding region; and a bending region disposed between the display region and the binding region, and an inside of the bending region is provided with a metal trace;

the metal trace generates a tensile stress region and a compressive stress region when the bending region bends toward the binding region, a plurality of through holes are disposed on the metal trace, and a distribution density of the through holes corresponding to the tensile stress region is different from distribution density of the through holes corresponding to the compressive stress region.

In one embodiment, the bending region in a bent state is in a shape of semicircle arc.

In one embodiment, centerlines of the through holes intersect at one or more points.

In one embodiment, the bending region in a bent state is in a shape of non-semicircle arc.

In one embodiment, the bending region includes a first bending region, a second bending region, and a third bending region, the second bending region is adjacent to the display region, the third bending region is adjacent to the binding region, the first bending region is positioned between the second bending region and the third bending region, the first bending region is in a shape of semicircle arc, and a centerline of the OLED display panel is overlapped with a bend apex of the bending region.

In one embodiment, the through holes are disposed inside the first bending region.

In one embodiment, the bending region includes a first bending region, a second bending region, and a third bending region, the second bending region is adjacent to the display region, the third bending region is adjacent to the binding region, the first bending region is positioned between the second bending region and the third bending region, the first bending region is in a shape of semicircle arc, and a centerline of the OLED display panel is not overlapped with a bend apex of the bending region, and a length of the third bending region is shorter than length of the second bending region.

In one embodiment, the through holes are disposed inside the first bending region and the third bending region.

A display device provided by the present invention includes the OLED display panel mentioned above.

The beneficial effects of the present disclosure are that the OLED display panel and the display device provided by the present disclosure may efficiently relieve the stress by different density of the through holes corresponding to different distribution of stress regions inside the metal trace of the bending region, reduce the problems such as failure and bad products caused by metal trace cracks, reduce the difficulty of process, and allows the bending angle to be smaller, achieving narrower borders and providing favorable conditions for local thinning.

BRIEF DESCRIPTION OF THE SEVERAL VIEWS OF THE DRAWINGS

In order to more clearly illustrate the technical solutions in the embodiments of the present invention, the drawings used in the description of the embodiments will be briefly described below. It is obvious that the drawings in the following description are only some embodiments of the present invention. Other drawings can also be obtained from those skilled persons in the art based on these drawings without paying any creative effort.

DESCRIPTION OF SPECIFIC EMBODIMENTS OF THE INVENTION

The description of each of the following embodiments is provided with reference to the appending drawings to exemplify the specific embodiment that may be implemented. The directional terms, such as "upper," "lower,", "front", "back", "left," "right," "inside," "outside," and "lateral side" are based on the orientation or positional relationship shown in the drawings, and the terms are merely for convenience of description of the present invention, and thus they are not to be construed as limiting. In the drawings, elements with similar structure are denoted by the same reference symbols.

The present disclosure may solve the deficiency of the conventional organic light emitting diode (OLED) display panel and display device which may create cracks by concentrating the stress of the metal traces disposed on the bending region when bending, thereby causing the failure of signal transmission and abnormality of the screen.

Embodiment 1

Figure 1:
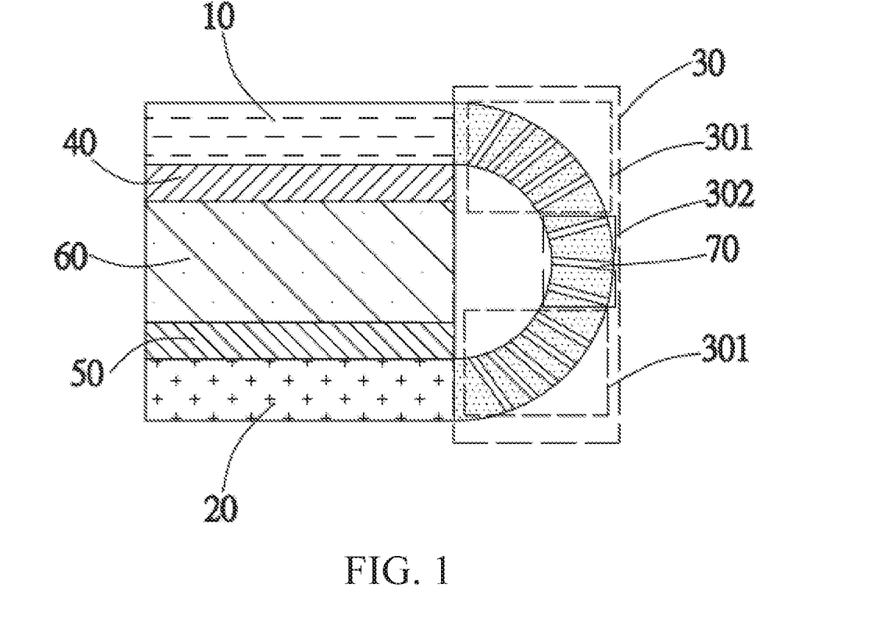
FIG. 1 is a schematic view of the distribution of through holes of the bending region of the first organic light emitting diode (OLED) display panel according to one embodiment of the present invention.

Referring to FIG. 1, an OLED display panel provided by the embodiment 1 of the present disclosure includes a display region 10, a back of the display region 10 is provided with a binding region 20, and a bending region 30 disposed between the display region 10 and the binding region 20. The display 10 is used for display images. The display region 10 further includes an array substrate. The array substrate includes thin film transistor device layer with array distribution. A corresponding surface of the thin film transistor device layer is provided with an OLED device layer. A back of the display region 10 is provided with a first backplane 40, and the first backplane 40 is used for bearing the display region 10.

An inside of the bending region 30 is provided with a metal trace. For example, The metal trace is a GOA circuit trace. One end of the metal trace extends into the display region 10 and connects to the thin film transistor device layer and the OLED device layer. The other end of the metal trace bends to the binding region 20. A surface of the binding region 20 is provided with a second backplane 50. The second backplane 50 is used to support the binding region 20. An inside of the binding region 20 is provided with a flexible printed circuit board, and the other end of the metal trace connects to the flexible printed circuit board. A reinforcing plate 60 is disposed between the first backplane 40 and the second backplane 50, which is used for enhancing the whole stability of the OLED display panel after bending.

A plurality of through holes 70 are disposed on the metal trace. The metal trace will generate a tensile stress region 301 and a compressive stress region 302 when the bending region 30 bends into the binding region 20. A distribution density of the through holes 70 corresponding to the tensile stress region 301 is different from distribution density of the through holes 70 corresponding to the compressive stress region 302. In the present embodiment, the distribution density of the through holes 70 corresponding to the tensile stress region 301 is greater than the distribution density of the through holes 70 corresponding to the compressive stress region 302. What needs to be explained is that the distribution density of the through holes 70 is defined as the area of the through holes 70 in the bending area 30 per unit length, i.e. the area of the through holes 70 is divided by the length of the bending region 30. As fixing the area of the through holes 70, the distribution density of the through holes 70 may be simplify to be the amounts of the through holes 70 or a distance between the two adjacent through holes 70. The distribution density of the through holes may refer to FIGS. 2A, 2B, and 2C.

Figure 2A:
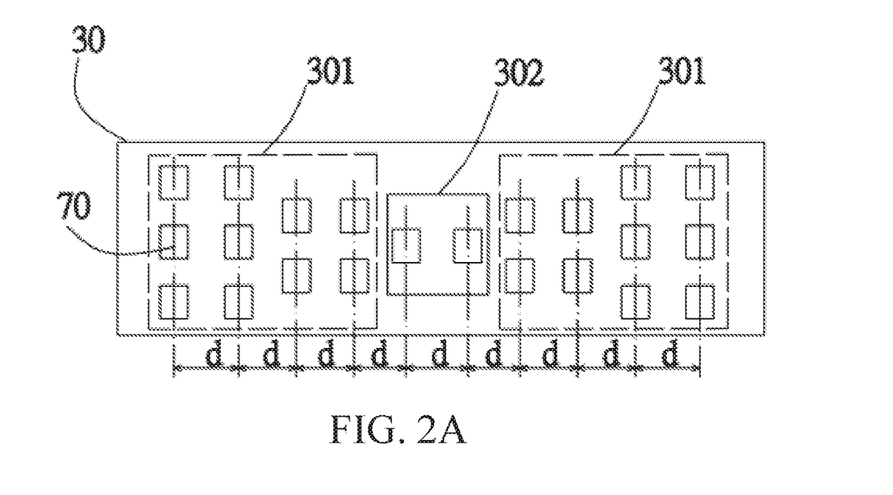
FIG. 2A to 2C are schematic views of the density of the through holes of the bending region of the OLED display panel shown in FIG. 1 of the present invention.

Referring to FIG. 2A, the distance between two of the through holes 70 adjacent to each other is fixed to be shown as "d". When fixing the area of each of the through holes 70, the distribution density of the through holes 70 in the tensile stress region 301 may be greater than the distribution density of the through holes 70 in the compressive stress region 302 by allowing the amount of the through holes 70 in the tensile stress region 301 to be greater than the amount of the through holes 70 in the compressive stress region 302.

Figure 2B:
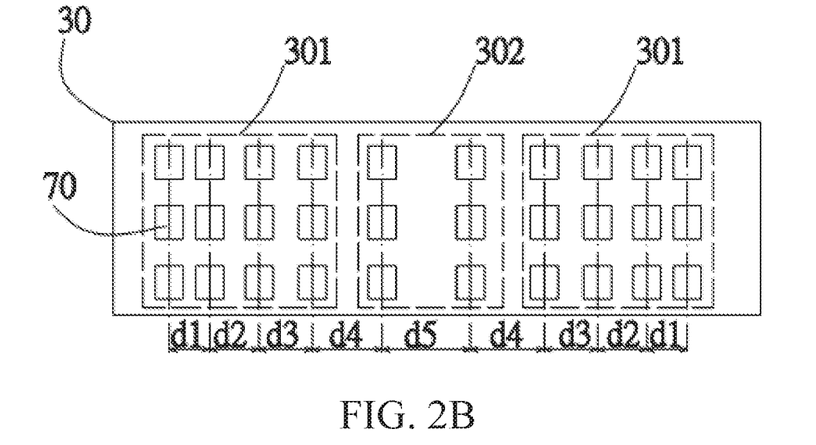

Referring to FIG. 2B, as fixing the area of each of the through holes 70, the distribution density of the through holes 70 in the tensile stress region 301 may be greater than the distribution density of the through holes 70 in the compressive stress region 302 by allowing the distance between two of the through holes 70 adjacent to each other in the tensile stress region 301 to be smaller than the distance between two of the through holes 70 adjacent to each other in the compressive stress region 302, specifically, d1<d2<d3<d4<d5.

Figure 2C:
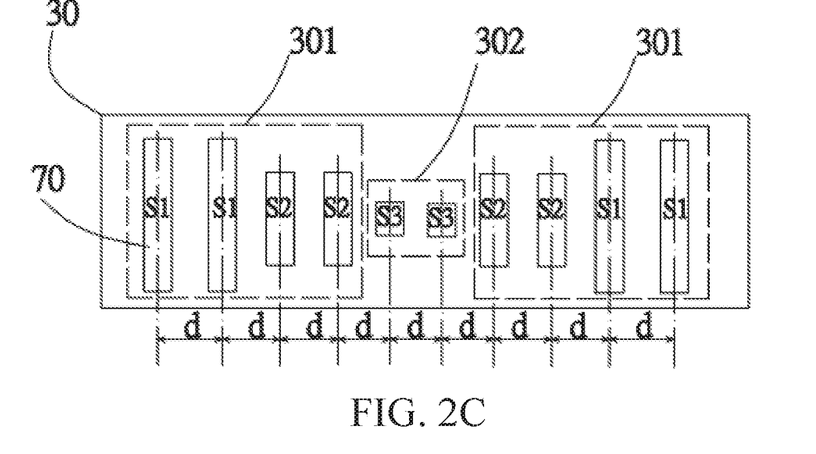

Referring to FIG. 2C, the distance between two of the through holes 70 adjacent to each other is fixed to be shown as "d". The distribution density of the through holes 70 in the tensile stress region 301 may be greater than the distribution density of the through holes 70 in the compressive stress region 302 by allowing the area of the through holes 70 in the tensile stress region 301 to be greater than the area of the through holes 70 in the compressive stress region 302, specifically, S1>S2>S3.

Further referring to FIG. 1, the bending region 30 is in a shape of semicircle arc, i.e. the bending region 30 only including a segment of arc allows the bendable angle of the OLED display panel to be smaller, further achieving narrower borders and providing possibility of local thinning. Specifically, the region located at two ends of the bending region 30 is the tensile stress region 301, and the region located in middle of the bending region 30 is the compressive stress region 302. Understandably, from the mechanical analysis, the bending stress in the tensile stress region 301 located at two ends of the bending region 30 is more serious, i.e. this region is prone to be breakage. Thus, the distribution density of the through holes 70 in the tensile stress region 301 greater than the distribution density of the through holes 70 in the compressive stress region 302, i.e. the tensile stress region 301 having greater bending stress corresponds to the through holes 70 with denser distribution, and the compressive stress region 302 having less bending stress corresponds to the through holes 70 with sparser distribution. The decrease of the bending stress in each region avoids the stress from concentrating, and enhances the bending property of the OLED display panel.

Figure 3A:
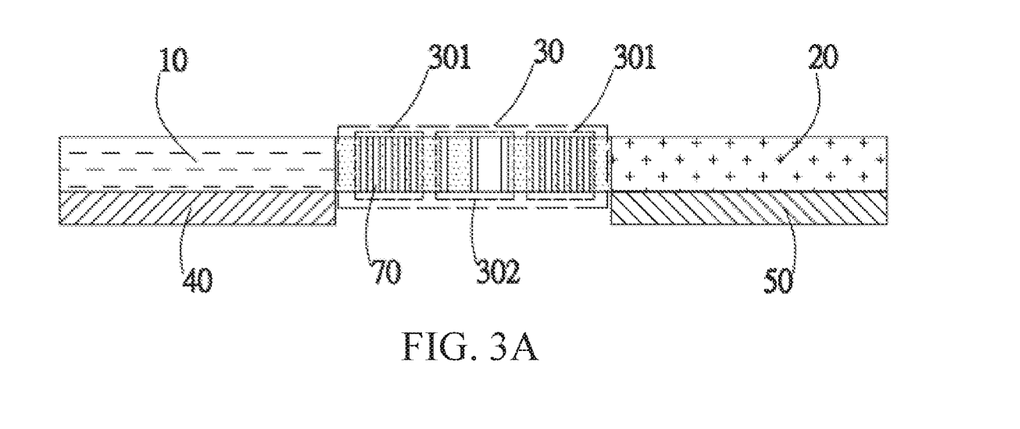
FIG. 3A is a schematic view of one type of the distribution of the through holes of the bending region in an expanded state of the OLED display panel shown in FIG. 3A of the present invention.
Figure 3B:
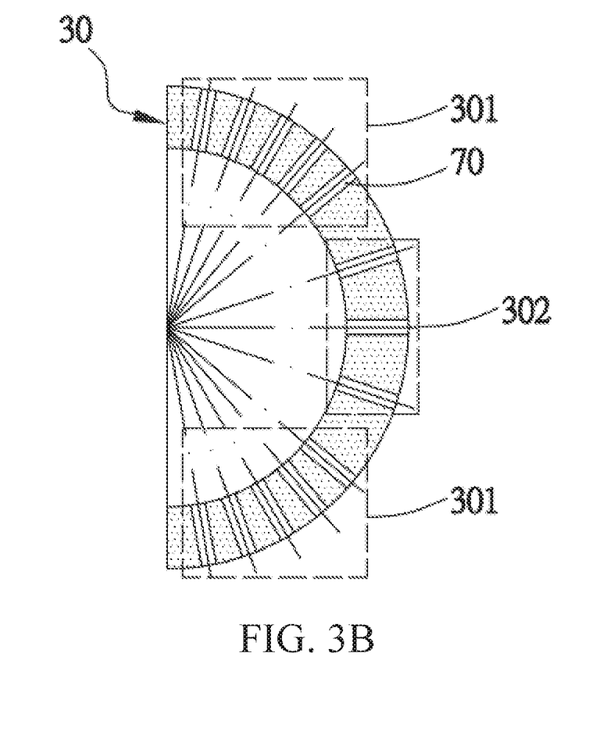
FIG. 3B is a schematic view of the distribution of the through holes of the bending region in a bent state of the OLED display panel shown in FIG. 3A of the present invention.

Specifically, the way for distributing the through holes 70 may be ordered or disordered. When the bending region 30 is in a shape of semicircle arc, the centerlines of the through holes 70 may be intersected at one point. For example, as shown in FIGS. 3A and 3B, the centerline is perpendicular to the bending region 30 in an expanded state, i.e. the centerlines of the through holes 70 is perpendicular to a tangent of the bending region 30 in the bent state. When any point located on the bending region 30 shares one center, the centerline of each of the through holes 70 may intersect at one point. That is to say, the centerline of each of the through holes 70 intersect at the center of the bending region 30.

Figure 4A:
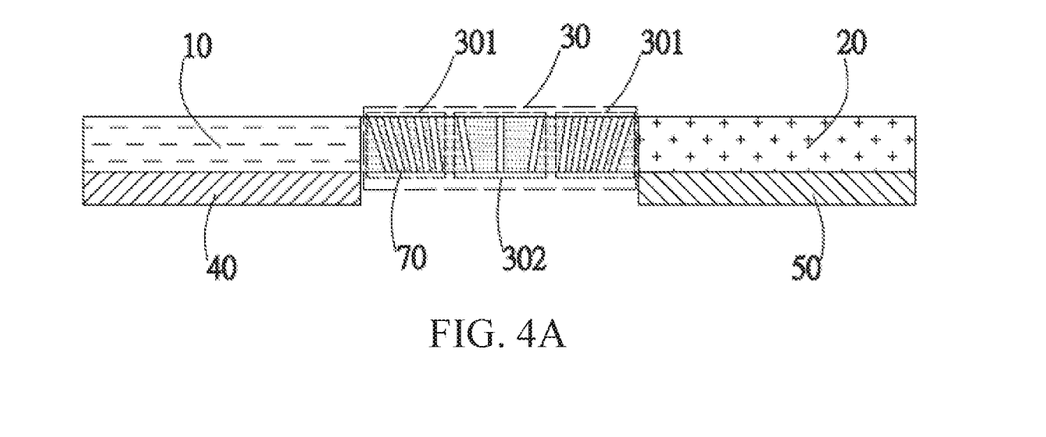
FIG. 4A is a schematic view of another type of the distribution of the through holes of the bending region in an expanded state of the OLED display panel shown in FIG. 1 of the present invention.
Figure 4B:
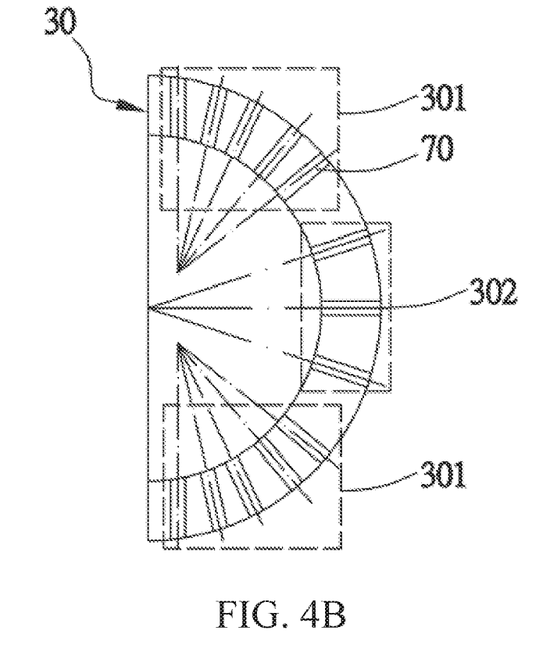
FIG. 4B is a schematic view of the distribution of the through holes of the bending region in a bent state of the OLED display panel shown in FIG. 4A of the present invention.

The centerline of the through holes may intersect at multiple points. For example, as shown in FIGS. 4A and 4B, a tilt angle is formed between the centerline of the through holes 70 and the bending region 30 in the expanded state, i.e. the centerline of each of the through holes 70 intersect at multiple points in the arc formed by the bending region 30 in the bent state. Understandably, the shape of the through holes 70 may be, but is not limited to, in a rectangular form, and may also be in one of the square form, circular form, triangular form, trapezoidal form or irregular form or multiple combination thereof.

Embodiment 2

When the bending state 30 is in a bent state, the bent region 30 may not be in a shape of semicircle arc. The bending region 30 may also be in a shape of non-semicircle arc. That is to say, the bending region 30 is consisted of multiple arcs.

Figure 5:
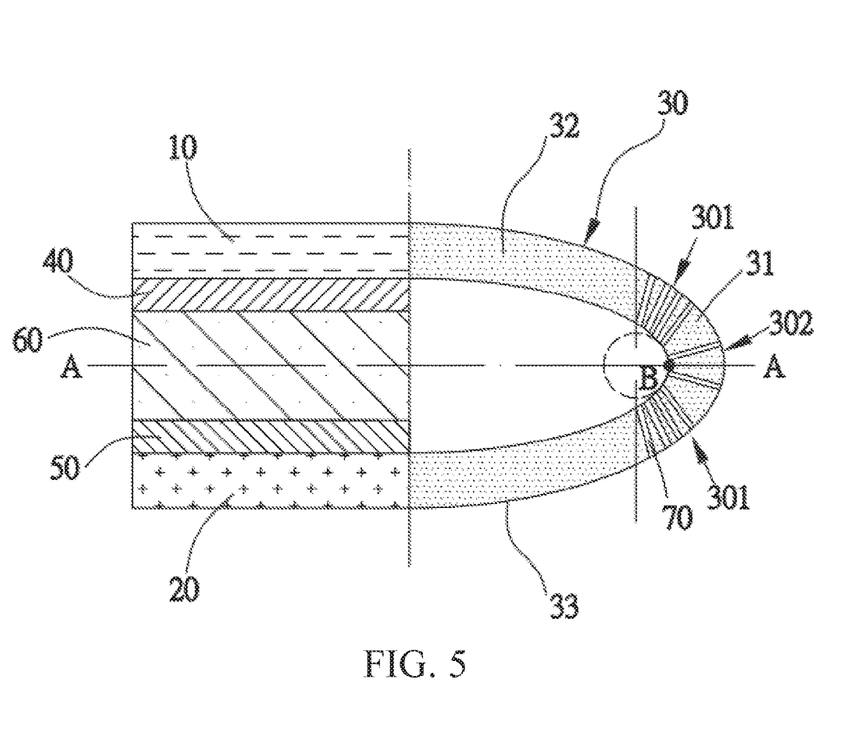
FIG. 5 is a schematic view of the distribution of through holes of the bending region of the second OLED display panel according to one embodiment of the present invention.

Based on the basis of Embodiment 1, FIG. 5 shows the schematic view of the distribution holes 70 of the bending region 30 of the OLED display panel provided by Embodiment 2 of the present disclosure. In the present embodiment, the bending region 30 is a symmetrical structure. Specifically, the bending region 30 is constituted by multiple arcs. The circle of curvature containing the arc at a bent apex B may be formed by the bent apex B of the bending region 30. The diameter of the circle of curvature in the vertical direction divides the bending region 30 to be a first bending region 31, a second bending region 32 and a third bending region 33. In one example, the second bending region 32 is closer to the display region 10, the third bending region 33 is closer to the binding region 20, and the first bending region 31 is located between the second bending region 32 and the third bending region 33. In one embodiment, the first bending region 31 is in a shape of semi-circle arc. The centerline A-A of the OLED display panel coincides with the bent apex B, and the bending region 30 relative to the centerline A-A of the OLED display panel is in a symmetrical structure, which means the length of the second bending region 32 is equal to the length of the third bending region 33.

Understandably, from the mechanical analysis, the first bending region 31 is the stress concentration region. A first tensile stress region 311 and a first compressive stress region 312 are generated by the metal traces inside the first bending region 31. The second bending region 32 and the third bending region 33 are stress mitigation regions. The through holes 70 may be disposed on the first bending region 31 in order to mitigate the concentration of stress in the first bending region 31, which is designed by the basis of the distribution density of the through holes 70 in the first tensile stress region 311 greater than the distribution density of the through holes 70 in the first compressive stress region 312. In one example, the specific distribution structure of the through holes 70 may refer to Embodiment 1, and it is no longer described herein. Moreover, the distribution of the through holes 70 may be disposed or may not be disposed on the second bending region 32 and the third bending region 33. It is not limited in the embodiment of the present disclosure.

Embodiment 3

Figure 6:
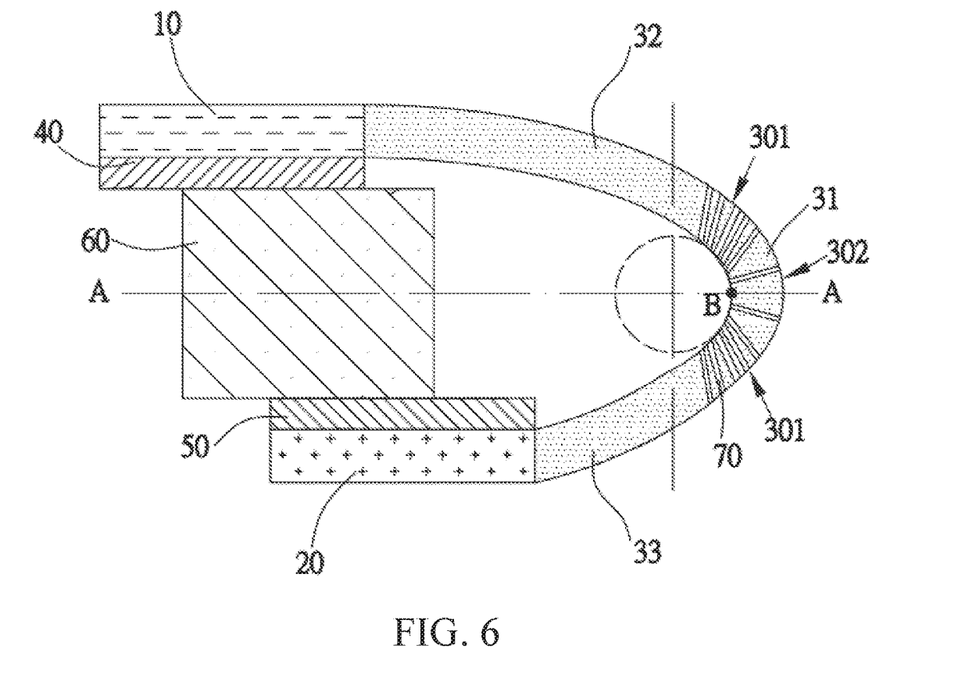
FIG. 6 is a schematic view of the distribution of through holes of the bending region of the third OLED display panel according to one embodiment of the present invention.

Based on the basis of Embodiment 2, FIG. 6 shows the schematic view of the distribution holes of the bending region of the OLED display panel provided by Embodiment 3 of the present disclosure. The bending region 30 is consisted of multiple arcs. The centerline A-A of the OLED display panel coincides with the bent apex B. The different with FIG. 5 is that in the present embodiment, the bending region 30 is a non-symmetrical structure. Similarly, the circle of curvature containing the arc at a bent apex B may be formed by the bent apex B of the bending region 30. The diameter of the circle of curvature in the vertical direction divides the bending region 30 to be a first bending region 31, a second bending region 32 and a third bending region 33. The length of the third bending region 33 is shorter than the length of the second bending region 32.

Understandably, from the mechanical analysis, only the first bending region 31 is the stress concentration region. A zero tensile stress region 301 and a zero compressive stress region 302 are generated in the first bending region 31. The second bending region 32 and the third bending region 33 are stress mitigation regions. The through holes 70 may be disposed on the first bending region 31 in order to mitigate the concentration of stress in the first bending region 31, which is designed by the basis of the distribution density of the through holes 70 in the zero tensile stress region 301 greater than the distribution density of the through holes 70 in the zero compressive stress region 302. In one example, the specific distribution structure of the through holes 70 may refer to Embodiment 1, and it is no longer described herein. Moreover, the distribution of the through holes 70 may be disposed or may not be disposed on the second bending region 32 and the third bending region 33. The distribution density of the through holes 70 disposed on the second bending region 32 and the third bending region 33 is not specifically limited, either. It is not limited in the embodiment of the present disclosure.

Embodiment 4

Figure 7:
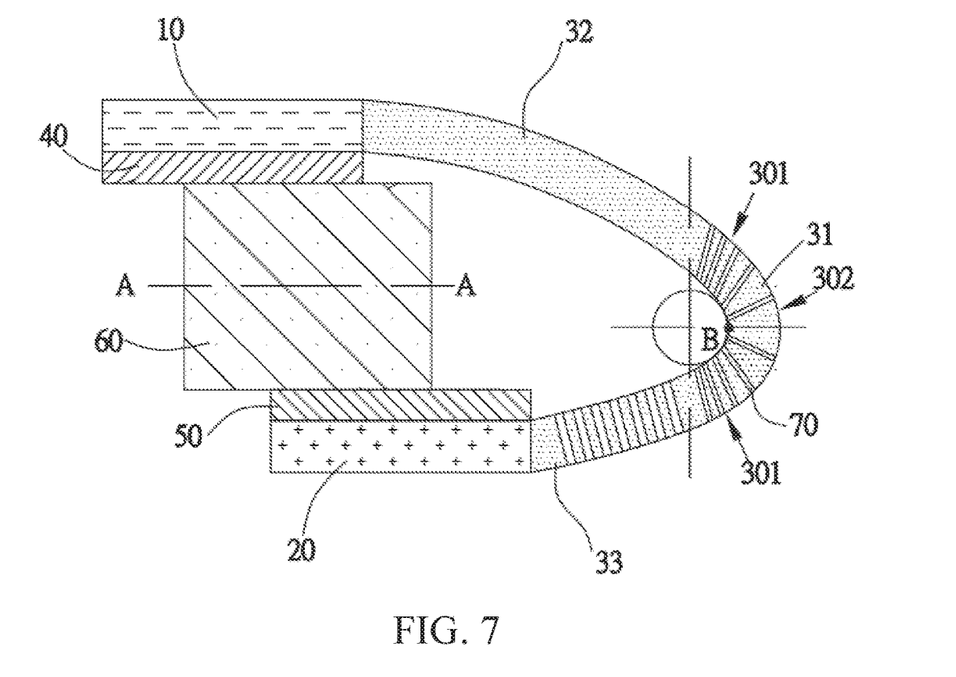
FIG. 7 is a schematic view of the distribution of through holes of the bending region of the fourth OLED display panel according to one embodiment of the present invention.

Based on the basis of Embodiment 1, FIG. 7 shows the schematic view of the distribution holes of the bending region of the OLED display panel provided by Embodiment 4 of the present disclosure. The different with FIG. 5 is that the centerline A-A of the OLED display panel does not coincide with the bent apex B, i.e. the bending region 30 is a non-symmetrical structure. The circle of curvature containing the arc at a bent apex B may be formed by the bent apex B of the bending region 30. The diameter of the circle of curvature in the vertical direction divides the bending region 30 to be a first bending region 31, a second bending region 32 and a third bending region 33. The length of the third bending region 33 is smaller than the length of the second bending region 32. The second bending region 32 is closer to the display region 10, the third bending region 33 is closer to the binding region 20, and the first bending region 31 is located between the second bending region 32 and the third bending region 33. The first bending region 31 is in a shape of semi-circle arc. The centerline A-A of the OLED display panel does not coincide with the bent apex B, and the length of the third bending region 33 is shorter the length of the second bending region 32. The bent apex B of the bending region 30 is located inside the first bending region 31.

Understandably, from the mechanical analysis, the stress in the first bending region 31 is more concentrated. A zero tensile stress region 301 and a zero compressive stress region 302 are generated in the first bending region 31. Moreover, the length of the second bending region 32 longer than the length of the third bending region 33 results in the stress distribution of the third bending region 33 to be more concentrated than the distribution density of the second bending region. Thus, the through holes 70 disposed on the first bending region 31 and the third bending region 32 according to the metal traces affected by the stress condition, which is based on the distribution density of the through holes 70 in the tensile stress region 301 greater than the distribution density of the through holes 70 in the compressive stress region 302. At meanwhile, the distribution of the through holes 70 is designed based on the actual stress condition received in the third bending region. In one example, the specific distribution structure of the through holes 70 may refer to Embodiment 1, and it is no longer described herein. Moreover, the distribution of the through holes 70 may be disposed or may not be disposed on the second bending region 32 and the third bending region 33. The distribution density of the through holes 70 disposed on the second bending region 32 is not specifically limited, either. It is not limited in the embodiment of the present disclosure.

Of course, when the length of the second bending region 32 is shorter than length of the third bending region, the distribution of the stress in the second bending region 32 is more concentrated than the distribution density of the third bending region 33. Thus, the through holes 70 may be disposed by the metal traces in the second region 32 according to the metal traces affected by the stress condition and it is no longer described herein.

Embodiment 5

The present disclosure further provide a display device, the display device includes the OLED display panel. The technical effect provided by the display device is the same as that provided by the OLED display panel. It may be referred to the abovementioned embodiments and it is no longer described herein.

The beneficial effects include that: the OLED display panel and the display device provided by the present disclosure may efficiently relieve the stress by different density of the through holes corresponding to different distribution of stress regions inside the metal trace of the bending region, reduce the problems such as failure and bad products caused by metal trace cracks, reduce the difficulty of process, and allows the bending angle to be smaller, achieving narrower borders and providing favorable conditions for local thinning.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. An organic light emitting diode (OLED) display panel, comprising:
 a display region, wherein a back of the display region is provided with a first backplane;
 a binding region disposed on the back of the display region, wherein a surface of the binding region is provided with a second backplane; and a bending region disposed between the display region and the binding region, wherein an inside of the bending region is provided with a metal trace;

wherein the metal trace generates a tensile stress region and a compressive stress region when the bending region bends toward the binding region, a plurality of through holes are disposed on the metal trace, wherein a distribution density of the through holes corresponding to the tensile stress region is different from distribution density of the through holes corresponding to the compressive stress region.

2. The OLED display panel according to claim 1, wherein the distribution density of the through holes corresponding to the tensile stress region is greater than the distribution density of the through holes corresponding to the compressive stress region.

3. The OLED display panel according to claim 1, wherein the bending region in a bent state is in a shape of semicircular arc.

4. The OLED display panel according to claim 3, wherein centerlines of the through holes intersect at one or more points.

5. The OLED display panel according to claim 1, wherein the bending region in a bent state is in a shape of non-semicircular arc.

6. The OLED display panel according to claim 5, wherein the bending region comprises a first bending region, a second bending region, and a third bending region, the second bending region is adjacent to the display region, the third bending region is adjacent to the binding region, the first bending region is positioned between the second bending region and the third bending region, the first bending region is in a shape of semicircular arc, and wherein a centerline of the OLED display panel is overlapped with a bend apex of the bending region.

7. The OLED display panel according to claim 6, wherein the through holes are disposed inside the first bending region.

8. The OLED display panel according to claim 5, wherein the bending region comprises a first bending region, a second bending region, and a third bending region, the second bending region is adjacent to the display region, the third bending region is adjacent to the binding region, the first bending region is positioned between the second bending region and the third bending region, the first bending region is in a shape of semicircular arc, and wherein a centerline of the OLED display panel is not overlapped with a bend apex of the bending region, and a length of the third bending region is shorter than length of the second bending region.

9. The OLED display panel according to claim 8, wherein the through holes are disposed inside the first bending region and the third bending region.

10. The OLED display panel according to claim 1, further comprising a reinforcing plate disposed between the first backplane and the second backplane.

11. An organic light emitting diode (OLED) display panel, comprising:

a display region;

a back of the display region is provided with a binding region; and a bending region disposed between the display region and the binding region, wherein an inside of the bending region is provided with a metal trace;

wherein the metal trace generates a tensile stress region and a compressive stress region when the bending region bends toward the binding region, a plurality of through holes are disposed on the metal trace, wherein a distribution density of the through holes corresponding to the tensile stress region is different from distribution density of the through holes corresponding to the compressive stress region.

12. The OLED display panel according to claim 11, wherein the distribution density of the through holes corresponding to the tensile stress region is greater than the distribution density of the through holes corresponding to the compressive stress region.

13. The OLED display panel according to claim 11, wherein the bending region in a bent state is in a shape of semicircle arc.

14. The OLED display panel according to claim 13, wherein centerlines of the through holes intersect at one or more points.

15. The OLED display panel according to claim 11, wherein the bending region in a bent state is in a shape of non-semicircle arc.

16. The OLED display panel according to claim 15, wherein the bending region comprises a first bending region, a second bending region, and a third bending region, the second bending region is adjacent to the display region, the third bending region is adjacent to the binding region, the first bending region is positioned between the second bending region and the third bending region, the first bending region is in a shape of semicircle arc, and wherein a centerline of the OLED display panel is overlapped with a bend apex of the bending region.

17. The OLED display panel according to claim 16, wherein the through holes are disposed inside the first bending region.

18. The OLED display panel according to claim 15, wherein the bending region comprises a first bending region, a second bending region, and a third bending region, the second bending region is adjacent to the display region, the third bending region is adjacent to the binding region, the first bending region is positioned between the second bending region and the third bending region, the first bending region is in a shape of semicircle arc, and wherein a centerline of the OLED display panel is not overlapped with a bend apex of the bending region, and a length of the third bending region is shorter than length of the second bending region.

19. The OLED display panel according to claim 18, wherein the through holes are disposed inside the first bending region and the third bending region.

20. A display device, comprising the organic light emitting diode (OLED) display panel as claimed in claim 11.

* * * * *